United States Patent
Johnson et al.

(10) Patent No.: US 10,044,156 B1
(45) Date of Patent: Aug. 7, 2018

(54) CABLE MANAGEMENT

(71) Applicant: EMC IP Holding Company, LLC, Hopkinton, MA (US)

(72) Inventors: Keith C. Johnson, Medway, MA (US); Thomas Thibodeau, Whitinsville, MA (US); Spero Tsefrekas, Shrewsbury, MA (US); Jonathan P. W. Sprague, West Boylston, MA (US); Antonio Fontes, Northbridge, MA (US)

(73) Assignee: EMC IP Holding Company, LLC, Hopkinton, MA (US)

( * ) Notice: Subject to any disclaimer, the term of this patent is extended or adjusted under 35 U.S.C. 154(b) by 0 days.

(21) Appl. No.: 15/497,561

(22) Filed: Apr. 26, 2017

(51) Int. Cl.
| | |
|---|---|
| *H01R 25/00* | (2006.01) |
| *H01R 13/58* | (2006.01) |
| *H01R 13/74* | (2006.01) |
| *H01R 13/595* | (2006.01) |
| *H05K 7/14* | (2006.01) |

(52) U.S. Cl.
CPC ....... *H01R 25/006* (2013.01); *H01R 13/5816* (2013.01); *H01R 13/595* (2013.01); *H01R 13/74* (2013.01); *H05K 7/1491* (2013.01)

(58) Field of Classification Search
CPC .. H01R 25/006; H01R 13/5816; H01R 13/74; H01R 13/595
See application file for complete search history.

(56) References Cited

U.S. PATENT DOCUMENTS

| | | | | |
|---|---|---|---|---|
| 4,579,403 | A * | 4/1986 | Byrne | H01R 35/02 439/33 |
| 5,041,002 | A * | 8/1991 | Byrne | H01R 35/02 439/211 |
| 5,987,203 | A * | 11/1999 | Abel | G02B 6/3825 385/134 |
| 6,215,654 | B1 * | 4/2001 | Wilkie, II | H02B 1/21 218/156 |
| 6,407,933 | B1 | 6/2002 | Bolognia et al. | |
| 6,646,893 | B1 | 11/2003 | Hardt et al. | |
| 6,944,383 | B1 | 9/2005 | Herzog et al. | |
| 7,140,911 | B1 * | 11/2006 | Rector | H01R 13/518 439/49 |
| 7,279,634 | B1 * | 10/2007 | Chang | G06F 1/189 174/50.5 |
| 7,416,435 | B2 * | 8/2008 | Onogi | H01R 23/661 439/445 |

(Continued)

OTHER PUBLICATIONS

Non-Final Office Action dated Nov. 16, 2017 in counterpart U.S. Appl. No. 15/497,442.

(Continued)

*Primary Examiner* — Alexander Gilman
(74) *Attorney, Agent, or Firm* — Brian J. Colandreo; Mark H. Whittenberger; Holland & Knight LLP

(57) ABSTRACT

A cabling module is cable management system is configured for use within an IT component and includes an internal cable bundle configured for use within the IT component. An external cable termination module is configured to terminate a first end of the internal cable bundle. A cabling module is configured to terminate a second end of the internal cable bundle. A cable management arm is positioned between the external cable termination module and the cabling module and is configured to absorb any slack in the internal cable bundle.

20 Claims, 8 Drawing Sheets

(56) References Cited

U.S. PATENT DOCUMENTS

| | | | |
|---|---|---|---|
| 7,491,095 B1* | 2/2009 | Huang | H01R 12/716 439/358 |
| 7,873,842 B2* | 1/2011 | Chen | G06F 1/189 439/188 |
| 7,994,426 B1* | 8/2011 | Rizzuto, Jr. | B65H 75/362 174/92 |
| 8,060,682 B1* | 11/2011 | Genetti | G06F 13/4022 370/400 |
| 8,068,351 B2* | 11/2011 | Figueroa | H02G 3/30 361/788 |
| 8,144,471 B2* | 3/2012 | Morimoto | H05K 1/147 174/255 |
| 8,241,058 B1 | 8/2012 | Fisher | |
| 8,814,445 B2* | 8/2014 | Gallegos | G02B 6/3879 385/59 |
| 8,873,250 B2 | 10/2014 | Kroupa | |
| 8,982,582 B2* | 3/2015 | Malek | H01Q 1/38 361/826 |
| 9,104,387 B1 | 8/2015 | Eichelberg | |
| 9,362,635 B2* | 6/2016 | Wild | H02G 1/02 |
| 9,392,722 B2* | 7/2016 | Skirmont | H05K 7/1492 |
| 9,520,043 B1 | 12/2016 | Alshinnawi et al. | |
| 9,531,645 B2* | 12/2016 | Loiferman | H04L 49/25 |
| 9,781,859 B1 | 10/2017 | Wishman et al. | |
| 2002/0071266 A1 | 6/2002 | Ikeura | |
| 2005/0041389 A1* | 2/2005 | Martin | G06F 1/183 361/679.31 |
| 2005/0057912 A1 | 3/2005 | Hardt et al. | |
| 2005/0237724 A1* | 10/2005 | Fiorentino | G06F 1/189 361/752 |
| 2006/0044754 A1* | 3/2006 | Hung | G06F 1/181 361/679.46 |
| 2006/0262492 A1* | 11/2006 | Tsai | G06F 1/26 361/601 |
| 2007/0270017 A1* | 11/2007 | Hardacker | H01P 1/042 439/357 |
| 2007/0270028 A1* | 11/2007 | Huang | H01R 13/641 439/502 |
| 2008/0139022 A1* | 6/2008 | Chen | H01R 13/645 439/101 |
| 2010/0110628 A1 | 5/2010 | Barrenechea et al. | |
| 2010/0172083 A1 | 7/2010 | Randall et al. | |
| 2010/0254652 A1* | 10/2010 | Kirkpatrick | H04Q 11/0005 385/17 |
| 2012/0044626 A1 | 2/2012 | Haigh | |
| 2012/0044627 A1 | 2/2012 | Haigh | |
| 2012/0069514 A1 | 3/2012 | Ross | |
| 2012/0162959 A1 | 6/2012 | Terada et al. | |
| 2013/0198532 A1 | 8/2013 | Bailey et al. | |
| 2013/0249286 A1 | 9/2013 | Hou et al. | |
| 2013/0321997 A1 | 12/2013 | Yi | |
| 2013/0342968 A1 | 12/2013 | Peterson et al. | |
| 2014/0069680 A1 | 3/2014 | Alshinnawi et al. | |
| 2014/0071602 A1 | 3/2014 | Alshinnawi et al. | |
| 2014/0281614 A1 | 9/2014 | Mick et al. | |
| 2014/0346866 A1 | 11/2014 | Feigl et al. | |
| 2015/0060009 A1 | 3/2015 | Shelnutt et al. | |
| 2015/0103488 A1 | 4/2015 | Tanaka | |
| 2015/0116913 A1 | 4/2015 | Kwon et al. | |
| 2015/0117077 A1 | 4/2015 | Huang et al. | |
| 2015/0177808 A1 | 6/2015 | Sarti | |
| 2015/0189787 A1 | 7/2015 | Bailey et al. | |
| 2015/0208544 A1 | 7/2015 | Liao et al. | |
| 2016/0044819 A1 | 2/2016 | Bailey et al. | |
| 2016/0205804 A1 | 7/2016 | Hartman | |
| 2016/0329689 A1 | 11/2016 | Yi | |
| 2016/0369844 A1 | 12/2016 | Ito et al. | |
| 2017/0071073 A1 | 3/2017 | Chen et al. | |
| 2017/0086325 A1 | 3/2017 | Connor et al. | |
| 2017/0108899 A1 | 4/2017 | Thul | |
| 2017/0111451 A1 | 4/2017 | Thul | |
| 2017/0150635 A1 | 5/2017 | Huang et al. | |
| 2017/0164505 A1 | 6/2017 | Sarti | |
| 2017/0181314 A1 | 7/2017 | Leigh et al. | |
| 2017/0222577 A1 | 8/2017 | Anderson et al. | |
| 2017/0303439 A1 | 10/2017 | Cader et al. | |

OTHER PUBLICATIONS

Non-Final Office Action dated Nov. 17, 2017 in counterpart U.S. Appl. No. 15/497,579.

Final Office Action issued in U.S. Appl. No. 15/497,579 dated June 12, 2018.

Final Office Action issued in U.S. Appl. No. 15/491442 dated May 25, 2018.

* cited by examiner

CABLE MANAGEMENT

TECHNICAL FIELD

This disclosure relates to cable management systems/components and, more particularly, to cable management systems/components for use within IT devices.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, various IT components that have different cabling requirements may be mounted within these IT racks, thus necessitating the use of different cabling, which may be difficult to change and may result in complications during the initial assembly of these IT components and/or the subsequent retrofit of the same.

SUMMARY OF DISCLOSURE

In one implementation, a cable management system is configured for use within an IT component and includes an internal cable bundle configured for use within the IT component. An external cable termination module is configured to terminate a first end of the internal cable bundle. A cabling module is configured to terminate a second end of the internal cable bundle. A cable management arm is positioned between the external cable termination module and the cabling module and is configured to absorb any slack in the internal cable bundle.

One or more of the following features may be included. The cabling module may include: an enclosure assembly configured to be received within the IT component; an input connector configured to receive electrical power from the internal cable bundle; and a plurality of output connectors configured to provide electrical power to a plurality of subcomponents of the IT component. The plurality of subcomponents of the IT component may include a plurality of power supply units. The plurality of output connectors may include a plurality of electrical cords. Each of the plurality of electrical cords may include a plug configured to releasably engage one of the plurality of power supply units. The enclosure assembly may be configured to be permanently affixed within the IT component. The enclosure assembly may be configured to be releasably affixed within the IT component. The enclosure assembly may be configured to be releasably affixed within the IT component via one or more fasteners. The cabling module may be configured to be a field replaceable unit. The input connector may be configured to releasably engage a chassis connector within the IT component. The chassis connector may be configured to releasably engage the second end of the internal cable bundle. The external cable termination module may include: one or more input connectors configured to receive electrical power; and one or more output connectors configured to provide electrical power to the internal cable bundle. The electrical power may be provided from a plurality of discrete power sources. The plurality of discrete power sources may be included within a power distribution unit. The external cable termination module may be configured to be releasably coupled to a power distribution unit.

In another implementation, a cable management system is configured for use within an IT component, the cable management system including: an internal cable bundle configured for use within the IT component; an external cable termination module is configured to terminate a first end of the internal cable bundle, wherein the external cable termination module includes: one or more input connectors configured to receive electrical power, and one or more output connectors configured to provide electrical power to the internal cable bundle. A cabling module is configured to terminate a second end of the internal cable bundle, wherein the cabling module includes: an enclosure assembly configured to be received within the IT component, an input connector configured to receive electrical power from the internal cable bundle, and a plurality of output connectors configured to provide electrical power to a plurality of subcomponents of the IT component. A cable management arm is positioned between the external cable termination module and the cabling module and is configured to absorb any slack in the internal cable bundle.

One or more of the following features may be included. The plurality of subcomponents of the IT component may include a plurality of power supply units. The electrical power may be provided from a plurality of discrete power sources.

In another implementation, a cable management system is configured for use within an IT component, the cable management system including an internal cable bundle configured for use within the IT component. An external cable termination module is configured to terminate a first end of the internal cable bundle, wherein the external cable termination module includes: one or more input connectors configured to receive electrical power from a plurality of discrete power sources, and one or more output connectors configured to provide electrical power to the internal cable bundle. A cabling module is configured to terminate a second end of the internal cable bundle, wherein the cabling module includes: an enclosure assembly configured to be received within the IT component, an input connector configured to receive electrical power from the internal cable bundle, and a plurality of output connectors configured to provide electrical power to a plurality of power supply units. A cable management arm is positioned between the external cable termination module and the cabling module and is configured to absorb any slack in the internal cable bundle.

One or more of the following features may be included. The plurality of output connectors may include a plurality of electrical cords.

The details of one or more implementations are set forth in the accompanying drawings and the description below. Other features and advantages will become apparent from the description, the drawings, and the claims.

BRIEF DESCRIPTION OF THE DRAWINGS

FIG. 2A is a front view of the rack-mountable computing device of FIG. 2;

Like reference symbols in the various drawings indicate like elements.

DETAILED DESCRIPTION OF THE PREFERRED EMBODIMENTS

Figure 1:
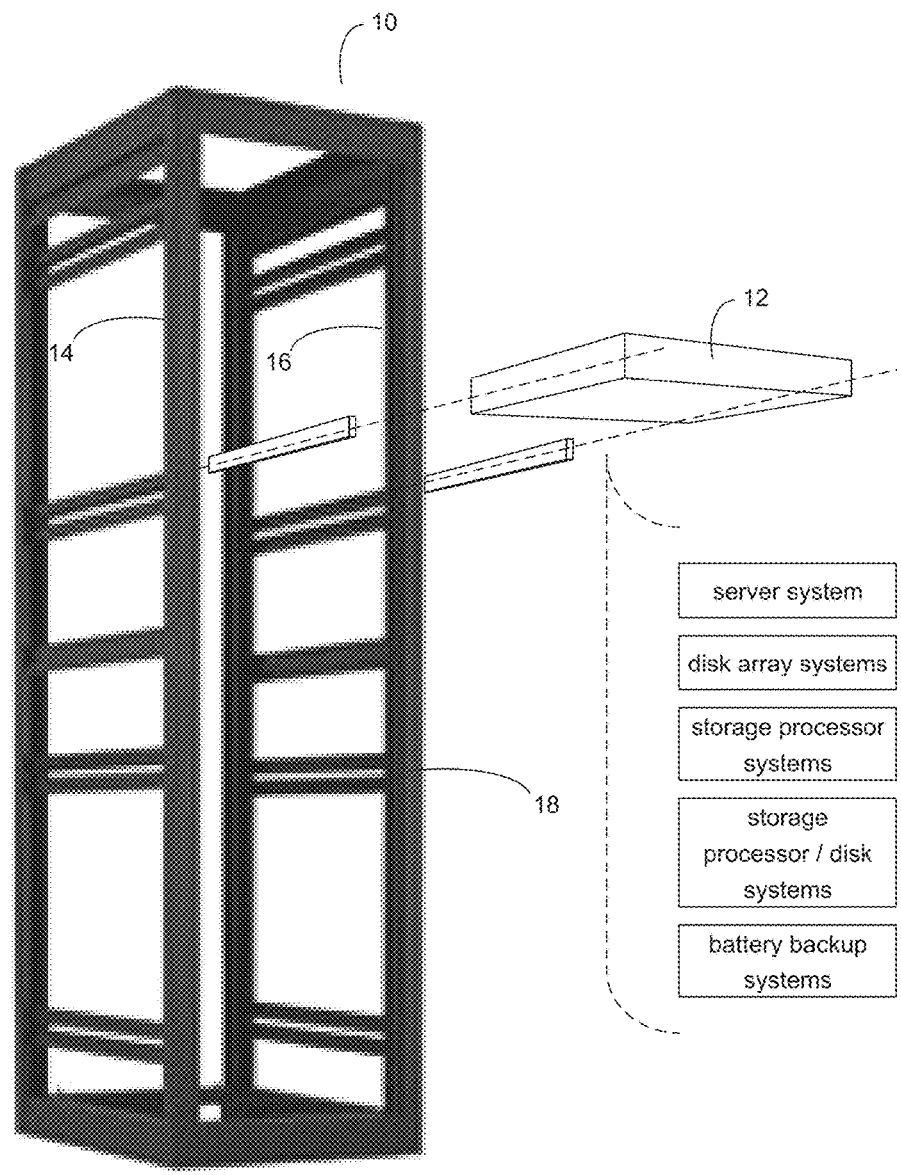
FIG. 1 is a perspective view of an IT rack and an IT component.

Referring to FIG. 1, IT racks (e.g., IT rack 10) may be utilized to store and organize IT components. For example, IT rack 10 may be placed within a computer room and various IT components (e.g., IT component 12) may be attached to rails (e.g., NEMA rails 14, 16) included within IT rack 10, wherein these rails (e.g., NEMA rails 14, 16) may have a standard and defined spacing between them (e.g., 19"). Typically, IT components that are configured to fit within IT rack 10 may be described as rack-mountable IT components.

Examples of the various IT components (e.g., IT component 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT components within IT rack 10. By standardizing the spacing between NEMA rails 14, 16, the various IT components that fit within a first IT rack may also fit within a second IT rack.

Typically, IT racks are defined in accordance with the number of rack units (U's) included within the rack. For example, a 1U IT component is half as high as a 2U IT component, which is half as high as a 4U IT component. Accordingly, while the number of rack units available within a particular IT rack may be rigidly defined by the size of the IT rack, the number of IT components mountable within that IT rack may vary depending upon the size (in rack units) of the particular IT components being mounted within that IT rack. Therefore, by reducing the number of rack units that a particular IT component uses within an IT rack, additional IT computing devices may be mounted within the IT rack.

Figure 2:
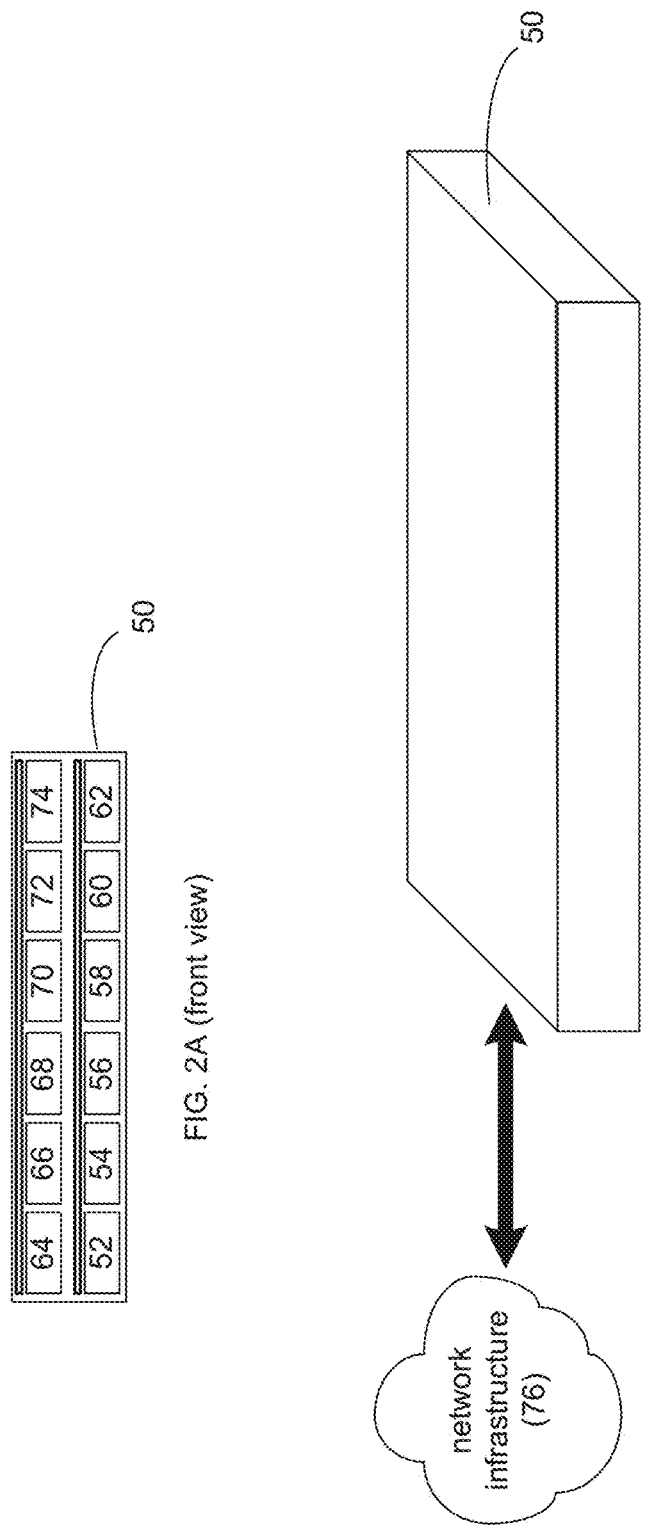
FIG. 2 is a diagrammatic view of a rack-mountable computing device for use within the IT rack of FIG. 1.

Referring to FIG. 2, there is shown one example of IT component 12, namely rack-mountable computing device 50. In this particular embodiment, rack-mountable computing device 50 may include a plurality of individual components, examples of which may include but are not limited to storage components, input/output components, and processing components, any of which may be a field replaceable unit (FRU) that is serviceable in the field.

Storage components may be the portion of rack-mountable computing device 50 that is configured to store data. Examples of such data may include but are not limited to data that is generated remotely (e.g., by applications that are executed on remote devices) or data that is generated locally (e.g., by applications that are executed on rack-mountable computing device 50). Accordingly, the storage component may be configured to include one or more storage devices, examples of which may include but are not limited to one or more rotating-media disk drives (e.g., SATA drives or SCSI drives) and/or one or more solid state storage devices (e.g., flash drives). For example and as shown in FIG. 2A, the storage component of rack-mountable computing device 50 may be configured to include (in this example) twelve 2.5 inch form factor storage devices (e.g., storage devices 52, 54, 56, 58, 60, 62, 64, 66, 68, 70, 72, 74).

The input/output components of rack-mountable computing device 50 may be the portion of rack-mountable computing device 50 that is configured to couple rack-mountable computing device 50 to a network infrastructure (e.g., network infrastructure 76), wherein network infrastructure 76 may be configured to couple rack-mountable computing device 50 to other rack-mountable computing devices, other IT components (e.g., server systems, disk array systems, storage processor systems, storage processor/disk systems, and battery backup systems), other networking devices (e.g., switches, routers, bridges, wireless access points), and/or end user computing devices (e.g., desktop computers, laptop computers, notebook computers, smartphones, tablet computers, etc.). Examples of network infrastructure 76 may include but are not limited to an Ethernet infrastructure; a fiber channel infrastructure; and an infiniband infrastructure.

The processing components of rack-mountable computing device 50 may be the portion of rack-mountable computing device 50 that is configured to process data, such as data that is generated remotely (e.g., by applications that are executed on remote devices) or data that is generated locally (e.g., by applications that are executed on rack-mountable computing device 50). Accordingly, the processing components of rack-mountable computing device 50 may be configured to include one or more microprocessors.

Figure 3:
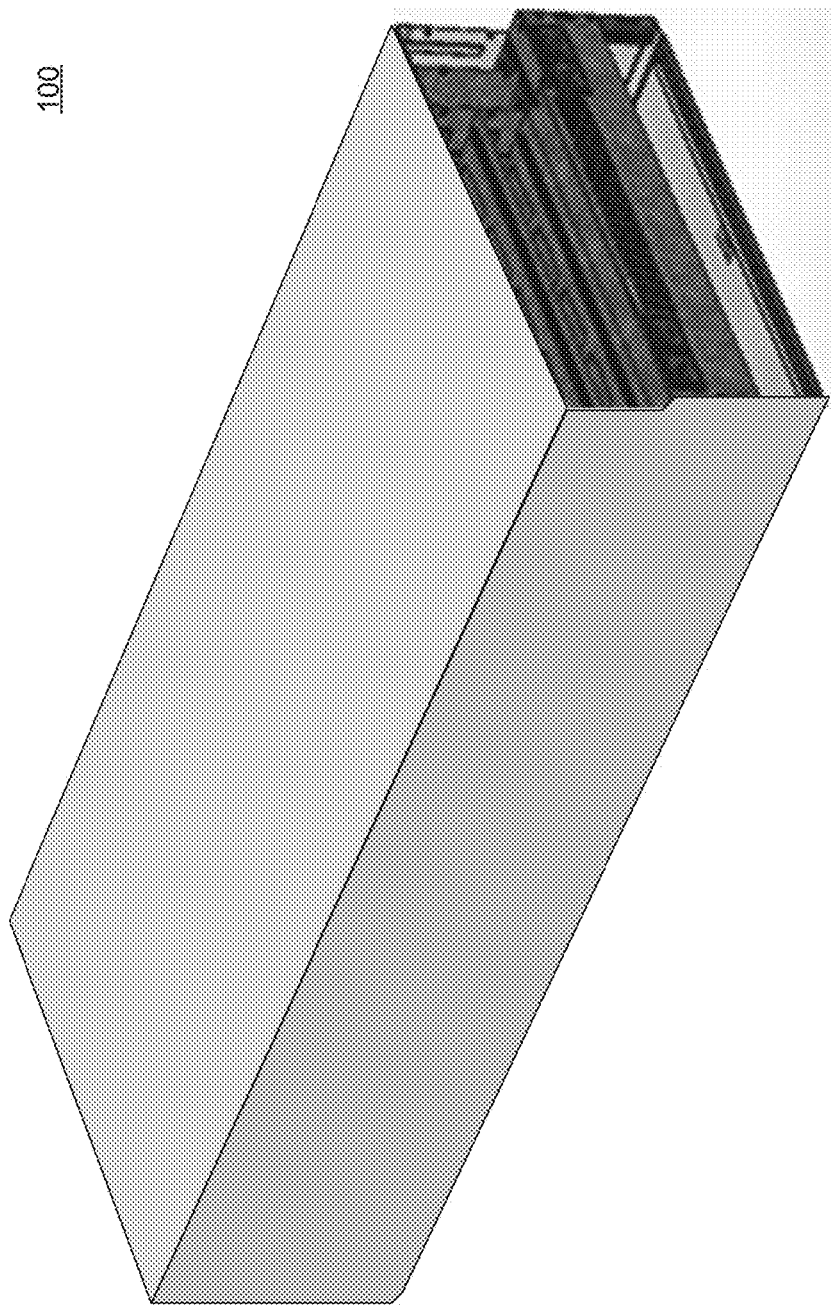
FIGS. 3-5 are diagrammatic views of a rack-mountable, hyper-converged computing device according to an aspect of this disclosure.

Referring also to FIG. 3, there is shown another example of IT component 12, namely rack-mountable, hyper-converged computing device 100. As is known in the art, hyper-convergence is a type of infrastructure system with a software-centric architecture that tightly integrates compute, storage, networking and virtualization resources and other technologies from scratch in a commodity hardware box supported by a single vendor. A hyper-converged system allows the integrated technologies to be managed as a single system through a common toolset. Hyper-converged systems may be expanded through the addition of nodes to the base unit.

Figure 4:
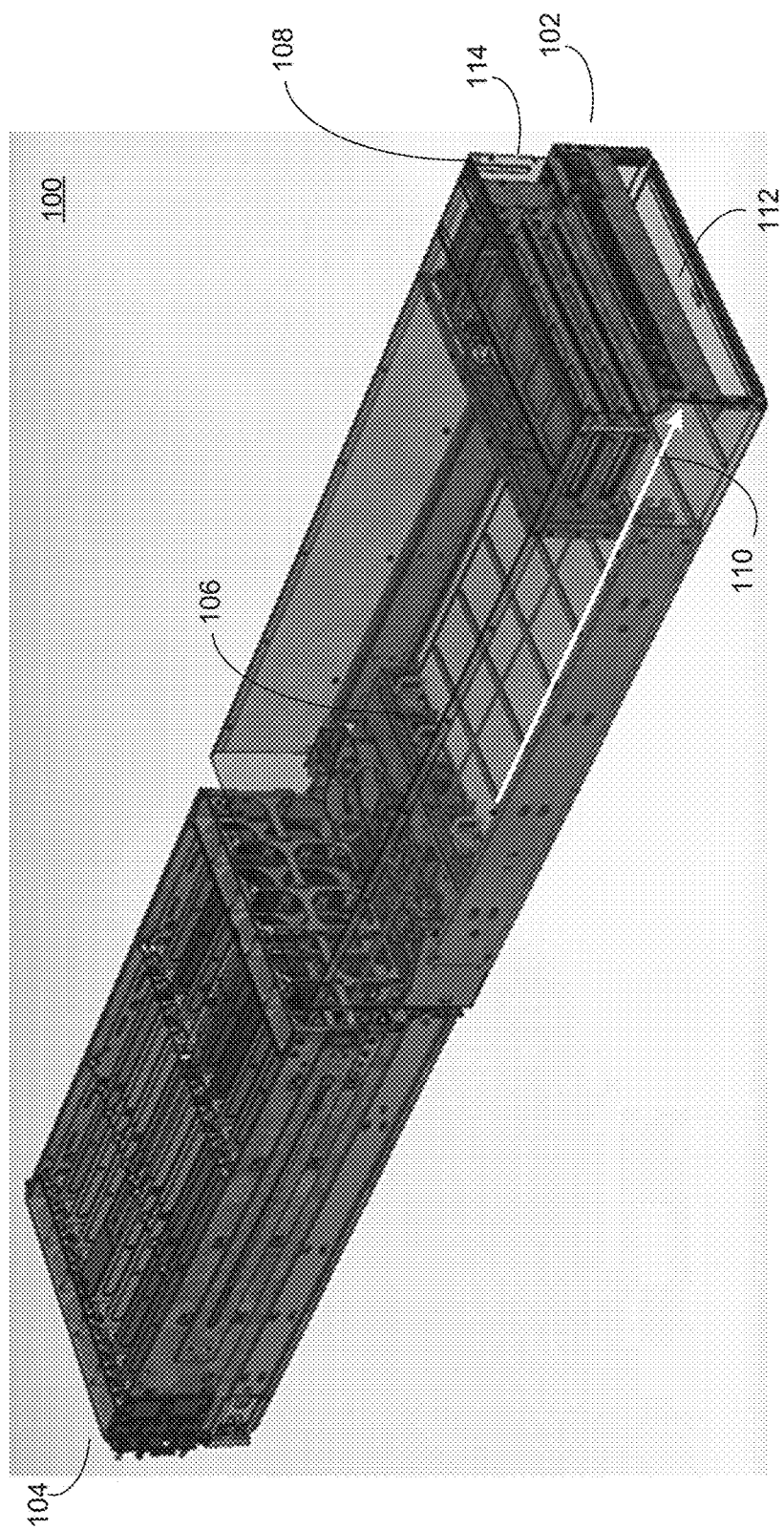

Referring also to FIG. 4, rack-mountable, hyper-converged computing device 100 may be quite large and quite densely packed. Additionally, the enclosure of rack-mountable, hyper-converged computing device 100 may be configured in a drawer fashion, wherein rack-mountable, hyper-converged computing device 100 includes a fixed portion (e.g., fixed portion 102) that may be rigidly affixed to IT rack 10 and a slidable portion (e.g., slidable portion 104) that may be configured to slide forwards (like a drawer) out of the front of IT rack 10 and away from fixed portion 102.

Additionally, slidable portion 104 of rack-mountable, hyper-converged computing device 100 may be configured so that the sub-components (e.g., storage devices, compute modules, memory modules) included within rack-mountable, hyper-converged computing device 100 may all be accessible and serviceable through the exposed top of slidable portion 104 once slidable portion 104 is slid forward and is clear of fixed portion 102 (as there will typically be another IT device mounted directly on top of rack-mountable, hyper-converged computing device 100).

Power supply units 106 within rack-mountable, hyper-converged computing device 100 may be coupled to slidable portion 104 of rack-mountable, hyper-converged computing device 100 and may, therefore, move with slidable portion 104 of rack-mountable, hyper-converged computing device 100. Accordingly, when rack-mountable, hyper-converged computing device 100 is in the extended/open position (as shown in FIG. 4), power supply units 106 may move forward and away from rear face 108 of rack-mountable, hyper-converged computing device 100. Conversely and when slidable portion 104 of rack-mountable, hyper-converged computing device 100 is pushed rearward into the closed position, power supply units 106 may move rearward (in the direction of arrow 110) and subsequently be positioned within opening 112 in rear face 108 of rack-mountable, hyper-converged computing device 100.

An upper portion (e.g., upper portion 114) of rear face 108 of rack-mountable, hyper-converged computing device 100 may be the area to which electrical power and data cables are attached. For example, data cables and power cables may be attached to various connectors on upper portion 114 of rear face 108 and interior cables carrying these signals may be routed within rack-mountable, hyper-converged computing device 100 in a manner that allows for this cabling to be coupled to and move with slidable portion 104 of rack-mountable, hyper-converged computing device 100.

Figure 5:
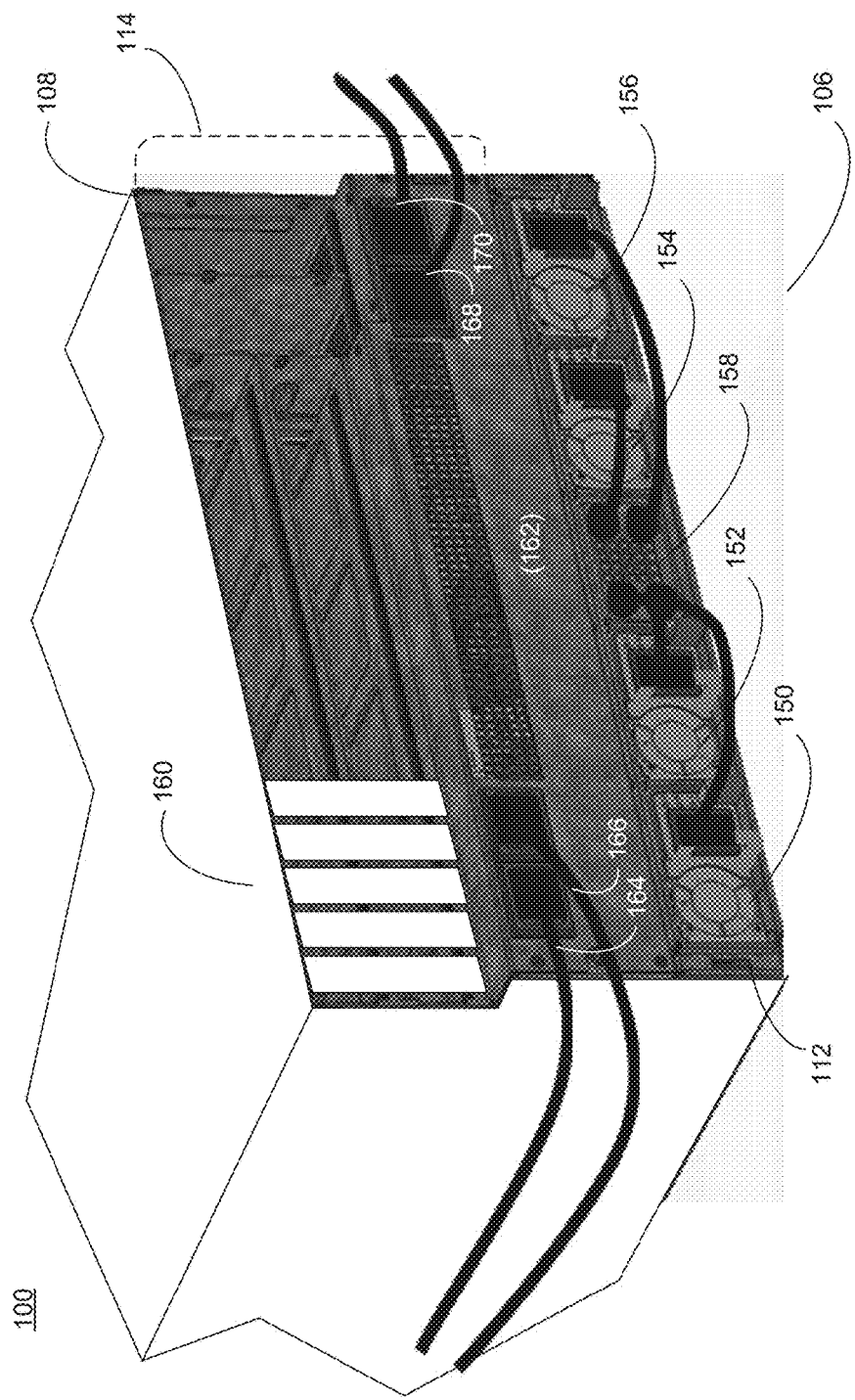

Referring also to FIG. 5, there is shown a detail view of rear face 108 of rack-mountable, hyper-converged computing device 100 in the closed position. Accordingly, power supply units 106 are shown positioned within opening 112 of rear face 108. Additionally and in this particular example, power supply units 106 are shown to include four discrete power supply units 150, 152, 154, 156 that are provided electrical power by cabling module 158 (to be explained below in greater detail).

As stated above, upper portion 114 of rear face 108 (which is affixed to fixed portion 102 of rack-mountable, hyper-converged computing device 100) may be configured so that electrical power and data cables may be attached to various connectors included therein/thereon. Accordingly and in this particular configuration, upper portion 114 of rear face 108 is shown to include plurality of host bus adapters 160 (for coupling data cables to rack-mountable, hyper-converged computing device 100). Internal data cables coupled to plurality of host bus adapters 160 may be routed within rack-mountable, hyper-converged computing device 100 and received by slidable portion 104 of rack-mountable, hyper-converged computing device 100 (which, as discussed above, may contain e.g., storage devices, computer modules, memory modules).

Upper portion 114 of rear face 108 is also shown to include external cable termination module 162 that (in this example) is configured to receive a plurality of discrete power sources. For example, as rack-mountable, hyper-converged computing device 100 is shown to include four discrete power supply units 150, 152, 154, 156, external cable termination module 162 may be configured to receive four discrete power sources (e.g., discrete power sources 164, 166, 168, 170), wherein discrete power sources 164, 166, 168, 170 may be releasably coupled to external cable termination module 162 and may be provided by one or more power distribution units (not shown). As is known in the art, a power distribution unit (or a main distribution unit) is a device fitted with multiple outputs that is designed to distribute electric power to e.g., racks of computers and networking equipment within a data center.

Accordingly, discrete power sources 164, 166, 168, 170 that are received by external cable termination module 162 may be routed within rack-mountable, hyper-converged computing device 100 and received by cabling module 158, wherein cabling module 158 may be configured to provide discrete power sources 164, 166, 168, 170 to discrete power supply units 150, 152, 154, 156 (respectively).

Figure 6:
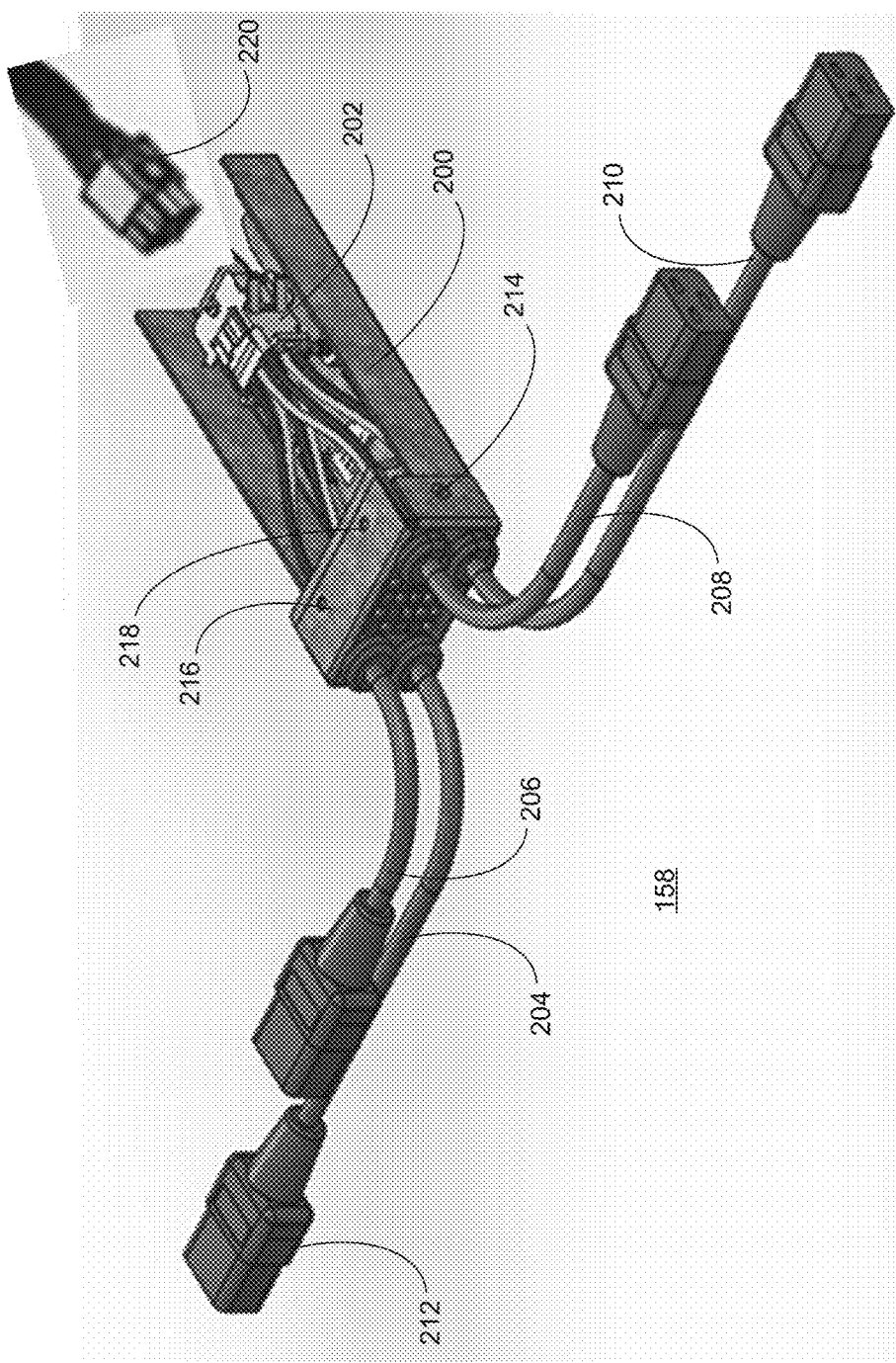
FIG. 6 is a diagrammatic view of a cabling module for use with the rack-mountable, hyper-converged computing device of FIGS. 3-5 according to an aspect of this disclosure.
Figure 7:
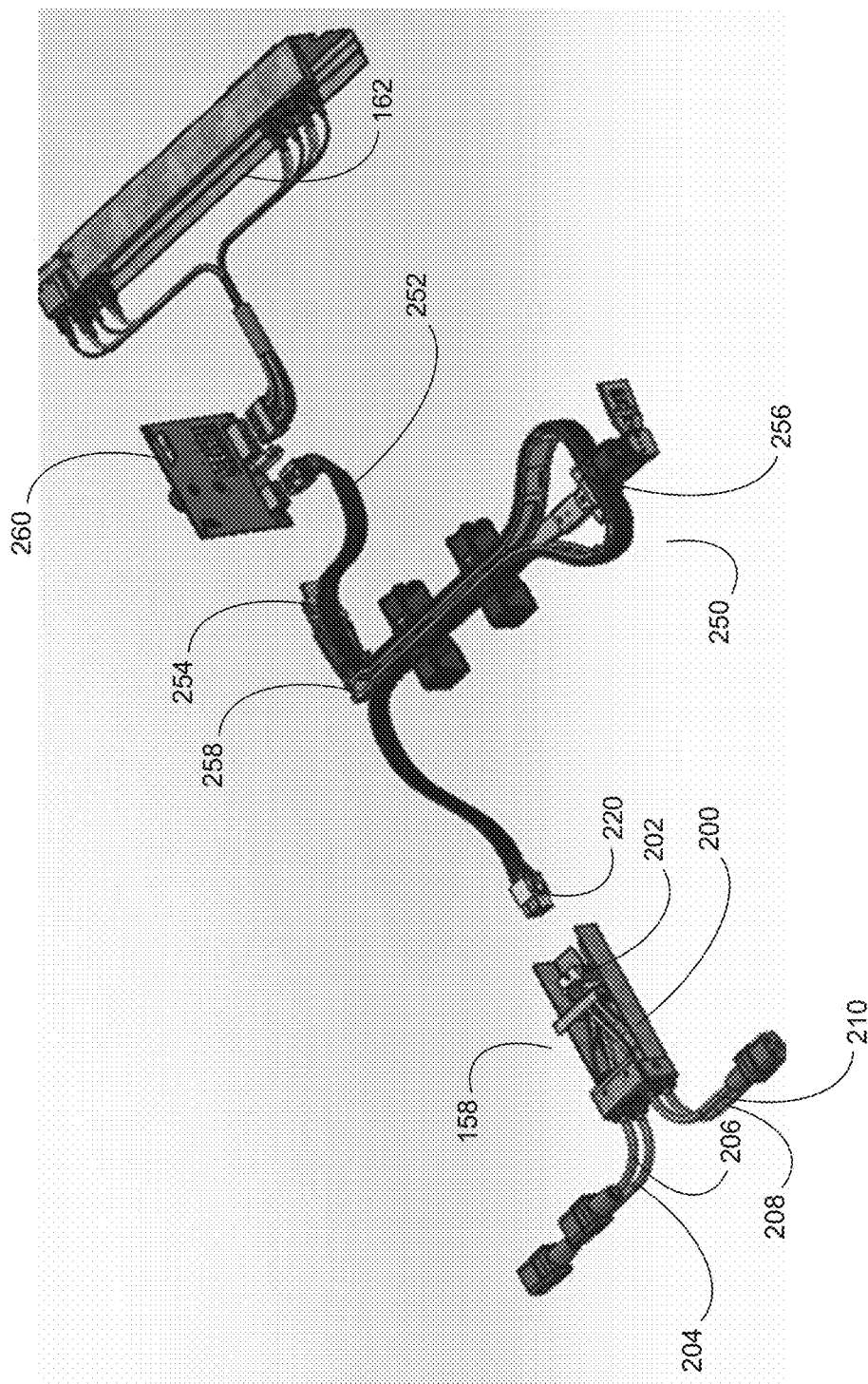
FIG. 7 is a diagrammatic view of a cable management system for use with the rack-mountable, hyper-converged computing device of FIGS. 3-5 according to an aspect of this disclosure.

Referring also to FIGS. 6-7, cabling module 158 may be configured for use within an IT component (e.g., rack-mountable, hyper-converged computing device 100). Cabling module 158 may include enclosure assembly 200 configured to be received within rack-mountable, hyper-converged computing device 100. For example, rack-mountable, hyper-converged computing device 100 may include a socket (not shown) into which enclosure 200 of cabling module 158 may be received.

Cabling module 158 may include an input connector 202 configured to receive electrical power (e.g., discrete power sources 164, 166, 168, 170) from within rack-mountable, hyper-converged computing device 100. Cabling module 158 may include plurality of output connectors (e.g., output connectors 204, 206, 208, 210) configured to provide electrical power (e.g., discrete power sources 164, 166, 168, 170) to a plurality of subcomponents (e.g., discrete power supply units 150, 152, 154, 156) of rack-mountable, hyper-converged computing device 100. While in this particular example, output connectors 204, 206, 208, 210 are shown to provide discrete power sources 164, 166, 168, 170 (respectively) to discrete power supply units 150, 152, 154, 156 (respectively), this is for illustrative purposes only and in not intended to be a limitation of this disclosure, as other configurations are possible and are considered to be within the scope of this disclosure. Plurality of output connectors 204, 206, 208, 210 may include a plurality of electrical cords, wherein each of the plurality of electrical cords may include a plug (e.g., plug 212) configured to releasably engage one of plurality of power supply units (e.g., power supply unit 150).

Enclosure assembly 200 may be configured to be permanently affixed within rack-mountable, hyper-converged computing device 100 or releasably affixed within rack-mountable, hyper-converged computing device 100. For example and if permanently affixed, enclosure assembly 200 may be crimped to/spot-welded to rack-mountable, hyper-converged computing device 100. Alternatively and if releasably affixed, enclosure assembly 200 may be releasably affixed to rack-mountable, hyper-converged computing device 100 via one or more fasteners (e.g., that are received by threaded holes 214, 216, 218). In such a configuration, cabling module 158 may be configured to be a field replaceable unit.

Input connector 202 may be configured to releasably engage chassis connector 220 within rack-mountable, hyper-converged computing device 100. For example, chassis connector 220 may be rigidly affixed within rack-mountable, hyper-converged computing device 100 so that when cabling module 158 is slid into rack-mountable, hyper-converged computing device 100, chassis connector 220 may releasably engage input connector 202.

Through the use of cabling module 158, rack-mountable, hyper-converged computing device 100 may be quickly and easily reconfigured based upon power needs/requirements. For example and depending upon the needs of rack-mountable, hyper-converged computing device 100, discrete power supply units 150, 152, 154, 156 may have either IEC C13 connectors (which are rated for 120/240 VAC @ 15 amps) or IEC C19 connectors (which are rated for 120/240

VAC @ 20 amps). As each of these connectors has a different pin configuration, in the event that you need to upgrade your power supply units from IEC C13 to IEC C19, cabling module 158 (with IEC C13 connectors) may be simply removed and replaced with another cabling module 158 (with IEC C19 connectors).

As discussed above, data cables and power cables may be attached to various connectors on upper portion 114 of rear face 112 and the interior cables carrying these signals may be routed within rack-mountable, hyper-converged computing device 100 in a manner that allows for this cabling to be coupled to and move with slidable portion 104 of rack-mountable, hyper-converged computing device 100.

Accordingly, rack-mountable, hyper-converged computing device 100 may include cable management arm 250 that may be configured to take up any slack in internal cable bundle 252 within rack-mountable, hyper-converged computing device 100 when in the closed position. Accordingly, the combination of cabling module 158, external cable termination module 162, cable management arm 250 and internal cable bundle 252 may form a cable management system that is configured to route electrical power through rack-mountable, hyper-converged computing device 100 and absorb any slack in internal cable bundle 252.

One example of such a cable management arm 250 is a spring loaded system that is normally in a closed position (as shown in FIG. 7). However, one or more bracket assemblies (e.g., bracket assembly 254) of cable management arm 250 may be mounted to one or more of fixed portion 102 and slidable portion 104 of rack-mountable, hyper-converged computing device 100. Further, cable management arm 250 may include a plurality of spring-loaded hinge assemblies (e.g., hinge assemblies 256, 258) that may be configured to allow for cable management arm 250 to be fully extended when rack-mountable, hyper-converged computing device 100 is in the open position. Rack-mountable, hyper-converged computing device 100 may further include filter system 260 that is configured to filter/condition discrete power sources 164, 166, 168, 170.

Figure 8:
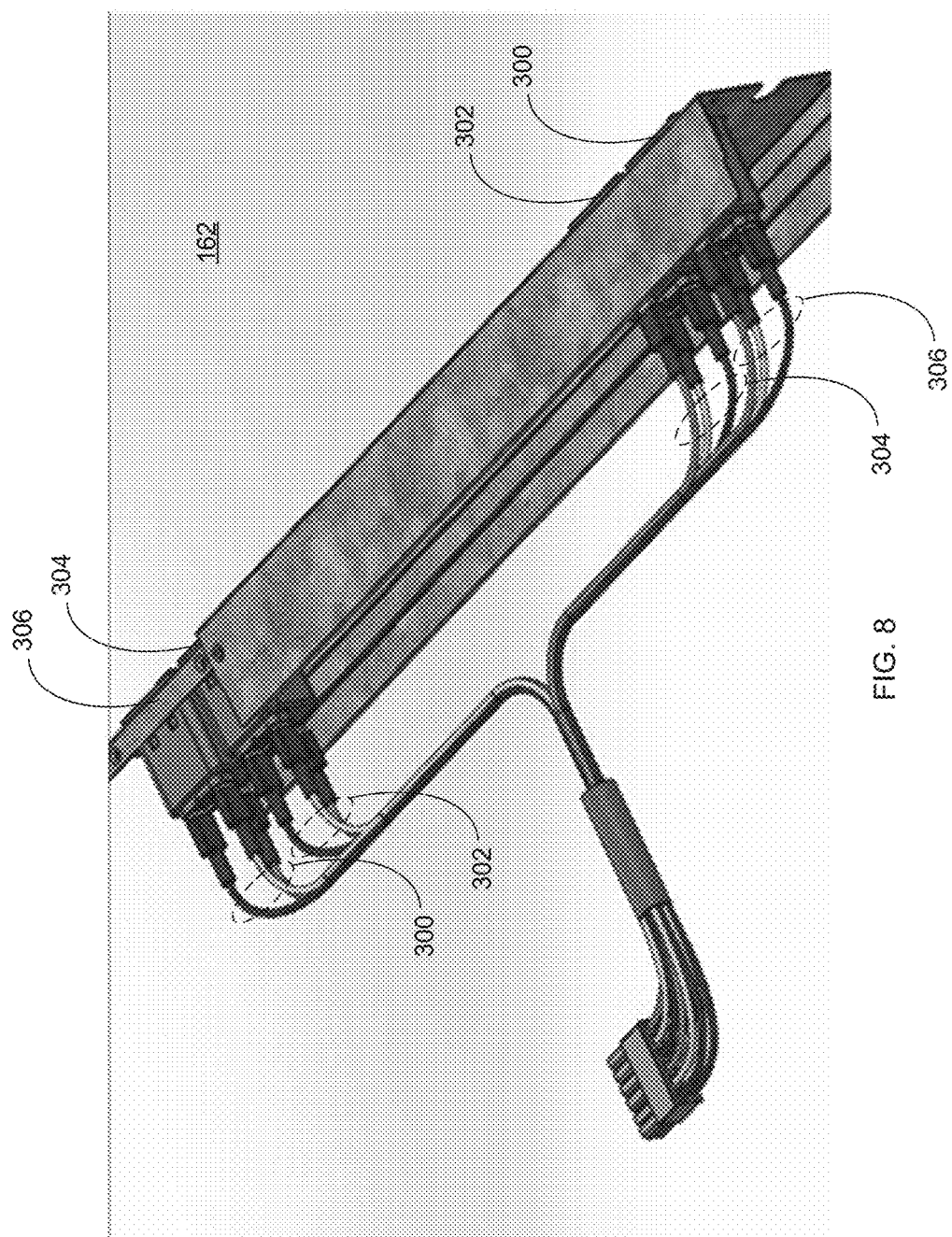
FIG. 8 is a diagrammatic view of an external cable termination module for use with the rack-mountable, hyper-converged computing device of FIGS. 3-5 according to an aspect of this disclosure.

Referring also to FIG. 8, external cable termination module 162 may include one or more input connectors (e.g., input connectors 300, 302, 304, 306 configured to receive electrical power. As discussed above, external cable termination module 162 may be configured to be coupled to discrete power sources 164, 166, 168, 170, wherein discrete power sources 164, 166, 168, 170 may be coupled to input connectors 300, 302, 304, 306. External cable termination module 162 may further include one or more output connectors (e.g., output connectors 308, 310, 312, 314) configured to provide the electrical power to internal cable bundle 252 (via filter system 260).

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A cable management system configured for use within an IT component, the cable management system comprising:
   an internal cable bundle configured for use within the IT component;
   an external cable termination module configured to terminate a first end of the internal cable bundle;
   a cabling module configured to terminate a second end of the internal cable bundle; and
   a cable management arm positioned between the external cable termination module and the cabling module and configured to absorb any slack in the internal cable bundle, wherein the cable management arm includes a plurality of spring-loaded hinge assemblies configured to allow the cable management arm to be extended.

2. The cable management system of claim 1 wherein the cabling module includes:
   an enclosure assembly configured to be received within the IT component;
   an input connector configured to receive electrical power from the internal cable bundle; and
   a plurality of output connectors configured to provide electrical power to a plurality of subcomponents of the IT component.

3. The cable management system of claim 2 wherein the plurality of subcomponents of the IT component includes a plurality of power supply units.

4. The cable management system of claim 3 wherein the plurality of output connectors includes a plurality of electrical cords.

5. The cable management system of claim 4 wherein each of the plurality of electrical cords includes a plug configured to releasably engage one of the plurality of power supply units.

6. The cable management system of claim 2 wherein the enclosure assembly is configured to be permanently affixed within the IT component.

7. The cable management system of claim 2 wherein the enclosure assembly is configured to be releasably affixed within the IT component.

8. The cable management system of claim 7 wherein the enclosure assembly is configured to be releasably affixed within the IT component via one or more fasteners.

9. The cabling module of claim 7 wherein the cabling module is configured to be a field replaceable unit.

10. The cable management system of claim 2 wherein the input connector is configured to releasably engage a chassis connector within the IT component.

11. The cable management system of claim 10 wherein the chassis connector is configured to releasably engage the second end of the internal cable bundle.

12. The cable management system of claim 1 wherein the external cable termination module includes:
one or more input connectors configured to receive electrical power; and
one or more output connectors configured to provide electrical power to the internal cable bundle.

13. The cable management system of claim 12 wherein the electrical power is provided from a plurality of discrete power sources.

14. The cable management system of claim 13 wherein the plurality of discrete power sources are included within a power distribution unit.

15. The cable management system of claim 12 wherein the external cable termination module is configured to be releasably coupled to a power distribution unit.

16. A cable management system configured for use within an IT component, the cable management system comprising:
an internal cable bundle configured for use within the IT component;
an external cable termination module configured to terminate a first end of the internal cable bundle, wherein the external cable termination module includes:
one or more input connectors configured to receive electrical power, and
one or more output connectors configured to provide electrical power to the internal cable bundle;
a cabling module configured to terminate a second end of the internal cable bundle, wherein the cabling module includes:
an enclosure assembly configured to be received within the IT component,
an input connector configured to receive electrical power from the internal cable bundle, and
a plurality of output connectors configured to provide electrical power to a plurality of subcomponents of the IT component; and
a cable management arm positioned between the external cable termination module and the cabling module and configured to absorb any slack in the internal cable bundle, wherein the cable management arm includes a plurality of spring-loaded hinge assemblies configured to allow the cable management arm to be extended.

17. The cable management system of claim 16 wherein the plurality of subcomponents of the IT component includes a plurality of power supply units.

18. The cable management system of claim 16 wherein the electrical power is provided from a plurality of discrete power sources.

19. A cable management system configured for use within an IT component, the cable management system comprising:
an internal cable bundle configured for use within the IT component;
an external cable termination module configured to terminate a first end of the internal cable bundle, wherein the external cable termination module includes:
one or more input connectors configured to receive electrical power from a plurality of discrete power sources, and
one or more output connectors configured to provide electrical power to the internal cable bundle;
a cabling module configured to terminate a second end of the internal cable bundle, wherein the cabling module includes:
an enclosure assembly configured to be received within the IT component,
an input connector configured to receive electrical power from the internal cable bundle, and
a plurality of output connectors configured to provide electrical power to a plurality of power supply units; and
a cable management arm positioned between the external cable termination module and the cabling module and configured to absorb any slack in the internal cable bundle, wherein the cable management arm includes a plurality of spring-loaded hinge assemblies configured to allow the cable management arm to be extended.

20. The cable management system of claim 19 wherein the plurality of output connectors includes a plurality of electrical cords.

* * * * *